United States Patent [19]

Nakamura et al.

[11] Patent Number: 6,133,377

[45] Date of Patent: Oct. 17, 2000

[54] COMPOSTION OF EPOXY RESIN, PHENOL-TRIAZINE-ALDEHYDE CONDENSATE AND RUBBER

[75] Inventors: Shigeo Nakamura; Yuki Miyazawa; Tadahiko Yokota, all of Kawasaki, Japan

[73] Assignee: Ajinomoto Co., Inc., Tokyo, Japan

[21] Appl. No.: 09/061,340

[22] Filed: Apr. 17, 1998

[30] Foreign Application Priority Data

Apr. 17, 1997 [JP] Japan ................................ 9-100057
Jun. 26, 1997 [JP] Japan ................................ 9-170052

[51] Int. Cl.⁷ ............................ C08K 9/10; C08L 63/02; C08L 63/04; B32B 27/38
[52] U.S. Cl. ...................... 525/109; 428/413; 428/416; 428/901; 523/207; 525/65
[58] Field of Search ................. 525/109, 65; 523/207; 428/413, 416, 901

[56] References Cited

U.S. PATENT DOCUMENTS

| 4,988,780 | 1/1991 | Das et al. | 525/504 |
| 5,874,009 | 2/1999 | Inada et al. | 156/153 |
| 5,965,269 | 10/1999 | Inada et al. | 525/112 |

FOREIGN PATENT DOCUMENTS

| 57-120 | 1/1982 | Japan . |
| 57-38824 | 3/1982 | Japan . |
| 61-133225 | 6/1986 | Japan . |
| 60-13582 | 8/1986 | Japan . |
| 1-165651 | 6/1989 | Japan . |
| 2-32118 | 2/1990 | Japan . |
| 4-153252 | 5/1992 | Japan . |
| 4-168121 | 6/1992 | Japan . |
| 6-16906 | 7/1992 | Japan . |
| 6-85117 | 3/1994 | Japan . |
| 7-268277 | 10/1995 | Japan . |
| 7-57265 | 10/1996 | Japan . |
| 8-253557 | 10/1996 | Japan . |
| 8-311142 | 11/1996 | Japan . |

*Primary Examiner*—Robert E. Sellers
*Attorney, Agent, or Firm*—Oblon, Spivak, McClelland, Maier & Neustadt, P.C.

[57] ABSTRACT

The present invention provides an epoxy resin composition comprising: (a) an epoxy resin having two or more epoxy groups in each molecule; (b) a phenolic resin composition comprising a condensation product of: (i) a phenol; (ii) a compound having a triazine ring; and (iii) an aldehyde, the mixture or condensation product being substantially free from any unreacted aldehydes, or methylol groups; (c) a rubber component; and (d) a curing accelerator. The epoxy resin composition has minute protrusions having a maximum height (Ry) $\leq 1.0$ μm, formed on its surface by thermosetting at or above 80° C. The invention also provides a process for manufacturing a multilayer printed-wiring board of the build-up type which has a formed copper plating layer.

13 Claims, 2 Drawing Sheets

COMPOSITION OF EPOXY RESIN, PHENOL-TRIAZINE-ALDEHYDE CONDENSATE AND RUBBER

BACKGROUND OF THE INVENTION

1. Field of the Invention

The present invention relates to an epoxy resin composition having a surface on which minute protrusions can be formed simply by thermosetting the resin composition. The composition is useful as an interlayer insulation material in a multilayer printed-wiring board of the build-up type consisting of alternate layers of conductor circuitry and insulating materials. The present invention also relates to a multilayer printed-wiring board containing the epoxy resin composition and to a process for manufacturing the same.

2. Discussion of the Background

One process which has been used for manufacturing multilayer printed-wiring boards comprises laminating copper foils onto an internal-layer circuit board having a circuit formed thereon, by using several prepreg sheets as insulating bonding layers. Each prepreg sheet is prepared by impregnating glass cloth with an epoxy resin and curing it to a B-stage. Interlayer continuity is achieved by through holes in an external layer. This process suffers from several disadvantages including high cost incurred by large-scale equipment and long production times required for molding the copper foils under heat and pressure using a laminating press. Also, the formation of a fine pattern is made difficult by an increased copper thickness due to the through-hole plating on the external layer.

Attention has recently been drawn as a means for solving these problems, to a technique in which organic insulating layers are formed alternately on conductor layers of an internal-layer circuit board for use in a multilayer printed-wiring board of the build-up type. Japanese Patent Applications Laid-Open Nos. Hei 7-304931 and Hei 7-304933 disclose a process for manufacturing a multilayer printed-wiring board by coating an internal-layer circuit board having a circuit formed thereon with an epoxy resin composition, curing it under heat, forming an uneven roughened surface thereon with a roughening agent and forming conductor layers by plating. Japanese Patent Application Laid-Open No. Hei 8-64960 discloses a process for manufacturing a multilayer printed-wiring board by applying an undercoat adhesive, preliminarily drying it, bonding an additive adhesive in film form thereto, curing it under heat, roughening it with an alkaline oxidizing agent and forming conductor layers by plating. All of these processes have the drawback of being low in productivity, since they have many time consuming steps requiring strict processing controls, including not only the prolonged step of roughening with an oxidizing agent, but also preparatory steps such as mechanical polishing and chemical swelling.

SUMMARY OF THE INVENTION

In view of the problems associated with the production of multilayer printed-wiring boards of the build-up type, it is an object of this invention to develop an epoxy resin composition for use in a multilayer printed-wiring board, having a surface on which minute protrusions can be formed simply by thermosetting the resin composition. It is also an object of the invention to simplify the process for making a multilayer printed-wiring board.

The above objects are achieved through the use of an epoxy resin composition comprising: (a) an epoxy resin having two or more epoxy groups in each molecule; (b) a phenolic resin composition comprising a mixture or condensation product of: (i) phenols, (ii) a compound having a triazine ring, and (iii) aldehydes, the mixture or condensation product being substantially free from any unreacted aldehydes, or methylol groups; (c) a rubber component; and (d) a curing accelerator. The epoxy resin composition has minute protrusions, which have a maximum height (Ry) $\leq 1.0$ μm, formed on its surface by thermosetting the composition at or above 80° C.

The process of this invention simplifies the manufacture of a multilayer printed-wiring board of the build-up type, having high heat resistance, since it is possible to form a copper plating layer of high adhesive strength without any mechanical grinding, or chemical swelling, by thermosetting the epoxy resin composition once it has been applied to the circuit board.

DETAILED DESCRIPTION OF THE INVENTION

Figure 1:
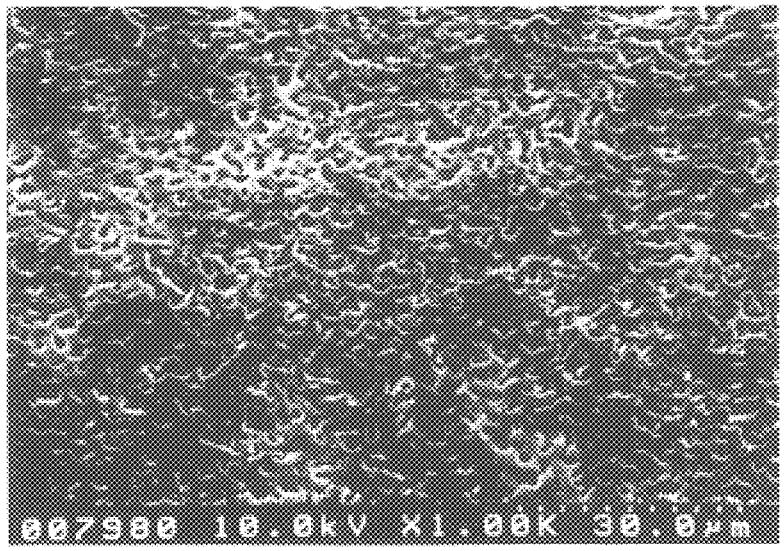
FIG. 1 is a traced view of a photograph taken through a SEM of the surface of the resin layer formed by applying the epoxy resin composition of Example 1 onto the internal-layer circuit board by screen printing, drying it at 120° C. for 10 minutes, and after its application and drying on the reverse side, too, thermosetting it at 150° C. for 30 minutes, as shown in Example 1 of Manufacture.

The epoxy resin having two or more epoxy groups in each molecule, which is used as component (a) according to this invention, is one which provides for an interlayer insulating material having sufficiently high heat and chemical resistance for long term board use, and good electrical properties. The epoxy resin may comprise, for example, one or more epoxides selected from bisphenol epoxy resins including: bisphenol A, bisphenol F, and bisphenol S epoxy resins; phenol novolak epoxy resins; alkylphenol novolak epoxy resins; naphthalene epoxy resins; dicyclopentadiene epoxy resins, an epoxidated product of a condensation product of phenols and aromatic aldehydes having phenolic hydroxyl groups; triglycidyl isocyanurate; alicyclic epoxy resins, and brominated products of any of the above epoxy resins. The composition may also contain a monofunctional epoxy resin as a reactive diluent.

Examples of the phenolic resin composition used as component (b) according to this invention include those which are disclosed in Japanese Patent Applications Laid-Open Nos. Hei 8-253557 and Hei 8-311142, hereby incorporated in their entirety by reference. More specifically the phenolic resin comprises a mixture or condensation product of: (i) phenols, (ii) a compound having a triazine ring, and (iii) aldehydes, said mixture or condensation product being substantially free from any unreacted aldehydes, or methylol groups. Preferred resins are Phenolite 7050 resins manufactured by Dainippon Ink & Chemical Industrial Co., Ltd. Phenolite resins are novolak resins containing a triazine structure as represented by structural formula (1) shown below.

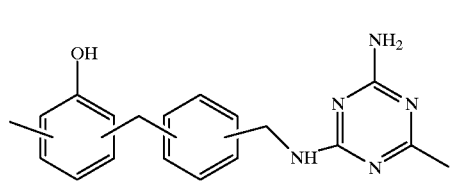

(1)

The phenolic resin composition (b) is preferably present in an amount such that there are from 0.5 to 1.3 phenolic hydroxyl equivalents thereof relative to one epoxy equivalent of the epoxy resin (a). As proportions outside this range are used, the heat resistance of any final product decreases.

Examples of the rubber component used as component (c) according to the present invention are polybutadiene rubbers, modified polybutadiene rubbers such as epoxy-, urethane- or (meth) acrylonitrile-modified polybutadiene rubbers, and (meth) acrylonitrile-butadiene rubbers containing carboxyl groups. The rubber component (c), is preferably present in an amount within the range of 5 to 50 parts by weight relative to a total of 100 parts by weight of the epoxy resin (a) and the phenolic resin composition (b). If the rubber component is present in amounts less than 5% by weight, it is not possible to obtain a satisfactorily uneven surface by thermosetting. Amounts exceeding 50% by weight result in an interlayer insulating material which is unacceptable for practical use because of its low heat resistance, electrical properties and chemical resistance.

The curing accelerator used as component (d) according to the present invention can be one or more of those which are conventional in the art including imidazoles, tertiary amines, guanidines, or epoxy adducts or microcapsulated products thereof, and organic phosphine compounds, such as triphenylphosphine, tetraphenyl phosphonium and tetraphenyl borate. The curing accelerator is preferably present in an amount within the range of 0.05 to 10 parts by weight relative to a total of 100 parts by weight of the epoxy resin (a) and the phenolic resin composition (b). Proportions of less than 0.05 part by weight result in insufficient curing. Proportions exceeding 10 parts by weight are not effective for any further acceleration of curing. In addition, as the proportion of curing accelerator increases above 10 parts by weight, heat resistance and mechanical strength decrease.

It is also possible to include binder polymers, thermosetting resins and/or other conventional additives in the composition of the present invention. Examples of binder polymers which may be used are (brominated) phenoxy resins, polyacrylic resins, polyamide resins, polyamideimide resins, polycyanate resins, polyester resins and thermosetting polyphenylene ether resins. Examples of thermosetting resins which may be used are blocked isocyanate resins, xylene resins, radical forming agents and polymerizable resins. Examples of other additives which may be included in the composition of the invention include inorganic fillers such as barium sulfate, barium titanate, silicon oxide powder, amorphous silica, talc, clay or mica powder, organic fillers such as silicone powder, nylon powder or fluorine powder, a thickening agents such as asbestos, orben or bentone, silicones, fluorine or high molecular weight defoaming and/or leveling agents and adhesion promoters such as imidazoles, thiazoles, triazoles, or silane coupling agents. It is also possible to include conventional coloring agents, such as Phthalocyanine Blue, Phthalocyanine Green, Iodine Green, Disazo Yellow, titanic oxide or carbon black.

The epoxy resin composition of the present invention may contain one or more organic solvents. Examples of organic solvents which may be used include ketones such as acetone, methyl ethyl ketone and cyclohexanone; acetic esters such as ethyl acetate, butyl acetate, cellosolve acetate, propylene glycol monomethyl ether acetate and carbitol acetate; cellosolves such as cellosolve and butyl cellosolve; carbitols such as carbitol and butyl carbitol; aromatic hydrocarbons such as toluene and zylene; dimethylformamide and dimethylacetamide.

Figure 2:
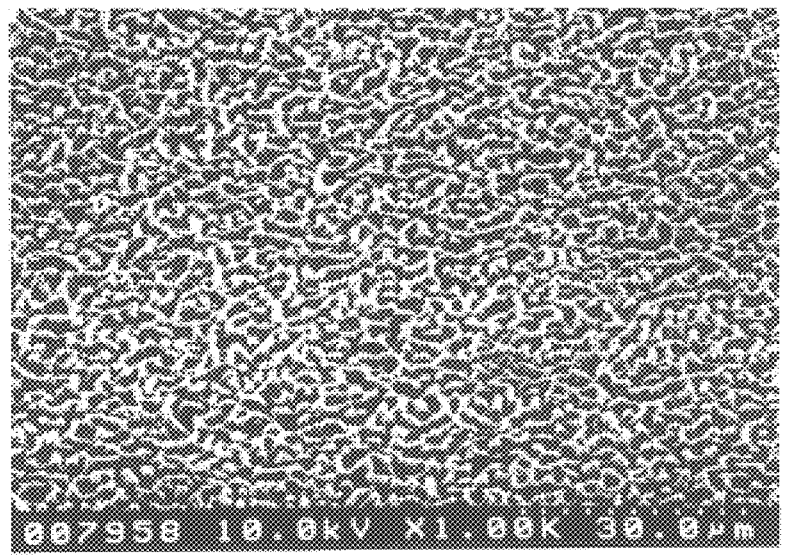
FIG. 2 is a traced view of a photograph taken through a SEM of the surface of the resin layer formed by laminating the adhesive film of Example 2 on both sides of the internal-layer circuit board by a vacuum laminator at a temperature of 100° C., a pressure of 1 kgf/cm$^2$ and an atmospheric pressure of 5 mm Hg or below, removing the PET film and thermosetting the resin composition at 150° C. for 30 minutes, as shown in example 2 of Manufacture.
Figure 3:
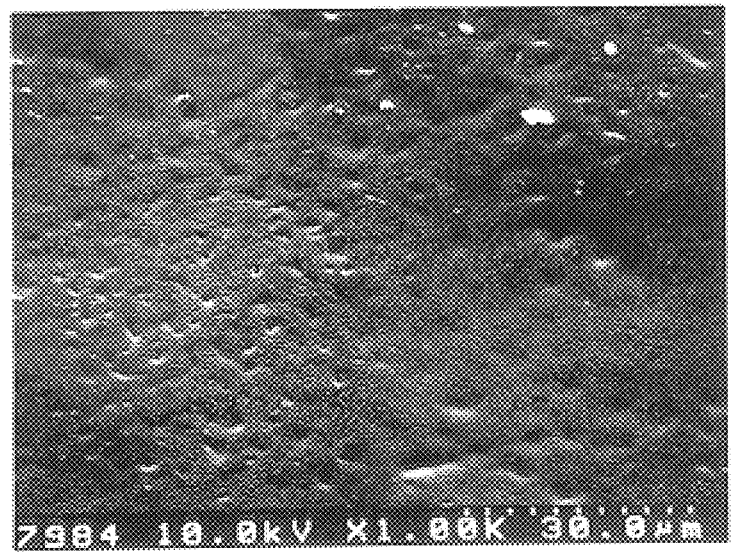
FIG. 3 is a traced view of a photograph taken through a SEM of the surface of the resin layer formed by applying the epoxy resin composition of Comparative Example 1 onto the internal-layer circuit board by screen printing, drying it at 120° C. for 10 minutes, and after its application and drying on the reverse side, too, thermosetting it at 150° C. for 30 minutes, as shown in Comparative Example 1 of Manufacture.

A multilayer printed-wiring board comprising the epoxy resin composition of the present invention can be prepared according to procedures known in the art. The epoxy resin composition may first be formed on a patterned internal-layer circuit board. The composition can be applied to the circuit board by any method known in the art including coating, screen printing and laminating. The composition is applied to the board, dried (if it contains an organic solvent) and thermoset. Compositions in the form of an adhesive film can be laminated on the board under heat, and thermoset. The internal-layer circuit board may, for example, be an epoxy/glass laminate, a metal board, a polyester board, a polyamide board, a BT resin board, or a thermosetting polyphenylene ether board, and may have a roughened surface. Thermosetting of the epoxy resin composition is carried out by heating it at or above 80° C., preferably between 100° C. and 180° C. for 15 to 90 minutes. The surface of the resin layer, as thermoset, has minute protrusions having a maximum roughness (Ry) $\leq 1.0 \mu m$ (FIGS. 1 and 2). Although it is not clear why the protrusions are formed simply by thermosetting, it has been determined that no protrusions are formed on the surface of a resin layer which is comprised of a conventional phenolic curing agent, such as phenol or cresol novolak, a polyfunctional epoxy resin, and a rubber component (FIG. 3). It is assumed that the surface of a resin layer rises and forms minute protrusions when a rubber component, forming an island structure by phase separation during thermosetting, is added to a curing agent having a crosslinking group differing in reactivity from a phenolic hydroxyl group and active hydrogen in triazine. The formation of these protrusions makes it possible to eliminate any mechanical grinding or chemical swelling treatment for carrying out the subsequent roughening treatment efficiently.

Then, the necessary through or via holes are made by a drill and/or a laser or plasma. Roughening treatment is performed by an oxidizing agent, such as permanganate, bichromate, ozone, hydrogen peroxide/sulfuric acid, or nitric acid. Since the surface of the resin layer already has minute protrusions, roughening is only necessary to remove any smear from the through holes. Roughening gives the protrusions an even better anchoring effect due to the fact that the rubber component is soluble in the oxidizing agent. Next, conductor layers are formed by electroless and/or electrolytic plating. If a plated resist having the reverse pattern from the conductor layers is formed, the conductor layers can be formed simply by electroless plating. After the conductor layers have been formed, annealing is done at 150° C. to 180° C. for 15 to 60 minutes to cure any residual unreacted epoxy resin and improve the heat resistance of the resin layer and the peel strength of the conductor layers to a further extent.

Examples

Having generally described this invention, a further understanding can be obtained by reference to certain specific examples which are provided herein for purposes of illustration only and are not intended to be limiting unless otherwise specified.

Example 1

An epoxy resin composition was prepared by dissolving 30 parts by weight (the proportions being all expressed in parts by weight throughout the following description) of a bisphenol A type epoxy resin (Epon 1001 of Yuka shell Epoxy Co., Ltd., having an epoxy equivalent of 469) and 40 parts of a cresol novolak type epoxy resin (EPICLON N-673 of Dainippon Ink & Chemical Industrial Co., Ltd., having an epoxy equivalent of 215) as component (a) and 30 parts of a phenol novolak resin containing a triazine structure (Phenolite KA-7052 of Dainippon Ink & chemical Industrial Co., Ltd. having a phenolic hydroxyl equivalent of 120) as component (b) in 20 parts of ethyl diglycol acetate and 20 parts of solvent naphtha under heating and stirring, and adding 15 parts of end-epoxidated polybutadiene rubber (Denarex R-45EPT of Nagase Chemical Industrial Co., Ltd.) as component (c), 1.5 parts of a crushed product of 2-phenyl-4,5-bis (hydroxymethyl) imidazole as component (d), 2 parts of finely divided silica and 0.5 parts of a silicone-based defoaming agent.

Example 2

An epoxy resin composition was prepared by dissolving 15 parts of a bisphenol A type epoxy resin (Epon 828EL of Yuka Shell Epoxy Co., Ltd., having an epoxy equivalent of 185), 15 parts of a bisphenol A type epoxy resin (Epon 1001 of Yuka Shell Epoxy Co., Ltd.) and 35 parts of a cresol novolak type epoxy resin (EPICLON N-673 of Dainippon Ink & Chemical Industrial Co., Ltd.) as component (a) in methyl ethyl ketone (hereinafter referred to as MEK) under heating and stirring, and adding 50 parts of a MEK varnish of a phenol novolak resin containing a triazine structure (Phenolite LA-7052 of Dainippon Ink & chemical Industrial Co., Ltd., containing 60% of nonvolatile matter having a phenolic hydroxyl equivalent of 120) as component (b), 10 parts of intramolecularly epoxidated polybutadiene rubber (Epolead PB-3600 of Daicel chemical Industrial Co., Ltd.) as component (c), one part of tetraphenylphosphonium-tetraphenylborate as component (d), 50 parts of a brominated phenoxy resin varnish (YPB-40-PXM40 of Tohto Chemical Co., Ltd, having a nonvolatile content of 40% by weight and a bromine content of 25% by weight and containing a solvent mixture of xylene, methoxypropanol and methyl ethyl ketone having a ratio of 5:2:8) and 2 parts of finely divided silica. The epoxy resin composition as prepared in varnish form was applied by a roller coater onto a PET film having a thickness of 38 μm to form a layer having a dry thickness of 65 μm, and was dried at 80° C. to 120° C. for 10 minutes, whereby an adhesive film was obtained.

Comparative Example 1

An epoxy resin composition was prepared by using 26 parts of a phenol novolak resin (BRG-557 of Showa High Molecule Co., Ltd., having a phenolic hydroxyl equivalent of 104) instead of the 30 parts of a phenol novolak resin containing a triazine structure and otherwise repeating Example 1.

Comparative Example 2

An epoxy resin composition was prepared by repeating Example 1, but eliminating the 15 parts of an end-epoxidated polybutadiene rubber (Denarex R-45EPT of Nagase Chemical Industrial Co., Ltd.).

Example 1 of Manufacture

An internal-layer circuit board was formed from an epoxy-glass laminate clad on both sides with a copper foil having a thickness of 35 μm, and the epoxy resin composition which had been prepared in Example 1 was applied thereon by screen printing, and dried at 120° C. for 10 minutes, and after its application and drying on the reverse side, too, it was thermoset at 150° C. for 30 minutes. A photograph of the surface of the resulting resin layer as taken through a SEM is shown in FIG. 1. Its surface roughness as determined (by SURFCOM470A of Tokyo Precision Co., Ltd.) confirmed the formation of minute protrusions having a maximum height (Ry) of 2 μm (JIS BO0601). Then, the necessary through or via holes were made by a drill and/or a laser, and after quick roughening with an alkaline oxidizing agent, such as permanganate, electroless and/or electrolytic plating was performed to make a four-layer printed-wiring board in accordance with a subtractive process. After 30 minutes of annealing at 170° C., the conductor was examined for its peel strength (JIS C6481) and showed an adhesive property as good as 1.0 kg/cm. The four-layer printed-wiring board was also tested for its heat resistance by 60 seconds of dipping in a solder bath at 260° C. and did not show any abnormal change in appearance.

Example 2 of Manufacture

An internal-layer circuit board was formed from an epoxy-glass laminate clad on both sides with a copper foil having a thickness of 35 μm, and the adhesive film which had been prepared in Example 2 was laminated on both sides of the board by a vacuum laminator at a temperature of 100° C., a pressure of 1 kgf/cm$^2$ and an atmospheric pressure of 5 mm Hg or below, whereafter the PET film was removed and the resin composition was thermoset at 150° C. for 30 minutes. A photograph of the surface of the resulting resin layer as taken through a SEM is shown in FIG. 2. Its surface roughness as determined confirmed the formation of minute protrusions having a maximum height (Ry) of 4 μm. Then, the necessary through or via holes were made by a drill and/or a laser, and after quick roughening with an alkaline oxidizing agent, such as permanganate, a plated resist having the reverse pattern from the conductor layers was formed to make a four-layer printed-wiring board in accordance with an additive process. After 60 minutes of annealing at 150° C., the conductor was examined for its peel strength and showed an adhesive property as good as 1.2 kg/cm. The four-layer printed-wiring board was also tested for its heat resistance by 60 seconds of dipping in a solder bath at 260° C. and did not show any abnormal change in appearance.

Comparative Example 1 of Manufacture

An internal-layer circuit board was formed from an epoxy-glass laminate clad on both sides with a copper foil having a thickness of 35 μm, and the epoxy resin composition which had been prepared in Comparative Example 1 was applied thereon by screen printing, and dried at 120° C. for 10 minutes, and after its application and drying on the reverse side, too, it was thermoset at 150° C. for 30 minutes. A photograph of the surface of the resulting resin layer as taken through a SEM is shown in FIG. 3. Nothing like minute protrusions was formed. An attempt was made to make a four-layer printed-wiring board by repeating Example 1 of Manufacture, but a blister was found in the conductor layers as plated.

Comparative Example 1 of Manufacture

Figure 4:
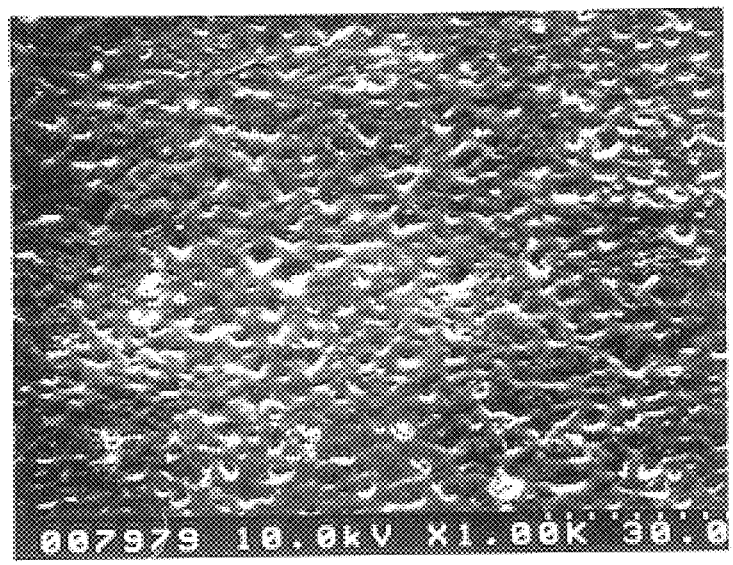
FIG. 4 is a traced view of a photograph taken through a SEM of the surface of the resin layer formed by applying the epoxy resin composition of Comparative Example 2 onto the internal-layer circuit board by screen printing, drying it at 120° C. for 10 minutes, and after its application and drying on the reverse side, too, thermosetting it at 150° C. for 30 minutes, as shown in Comparative Example 2 of Manufacture.

An internal-layer circuit board was formed from an epoxy-glass laminate clad on both sides with a copper foil having a thickness of 35 μm, and the epoxy resin composition which had been prepared in Comparative Example 2 was applied thereon by screen printing, and dried at 120° C. for 10 minutes, and after its application and drying on the reverse side, too, it was thermoset at 150° C. for 30 minutes. A photograph of the surface of the resulting resin layer as taken through a SEM is shown in FIG. 4. The measurement of its surface roughness gave an Ry value of 0.8 μm. Example 1 of Manufacture was repeated for making a four-layer printed-wiring board. A blister was, however, found in the conductor layers during 30 minutes of annealing at 170° C.

The results of Examples 1 and 2 and Example 1 and 2 of Manufacture confirm that the process of this invention enables the manufacture of a highly reliable multilayer printed-wiring board of the build-up type, having high heat resistance, since it is possible to form a copper plating layer of high adhesive strength without any mechanical grinding, or chemical swelling. According to Comparative Example 1 employing a conventional phenol novolak curing agent, and Comparative Example 2 not employing an rubber component, however, it was not possible to form an uneven surface having a satisfactory anchoring effect. The copper plating layer which was formed on the surface of the board in comparative Examples 1 and 2 had an adhesive strength which was too low to be practically acceptable.

This application claims priority from Japanese Patent Application Nos. 100057/1997 and 170052/1997, filed with the Japanese Patent Office on Apr. 17, 1997 and on Jun. 26, 1997, respectively, the entire contents of which are herein incorporated by reference.

Having now fully described the invention, it will be apparent to one of ordinary skill in the art that many changes and modifications can be made thereto without departing from the spirit or scope of the invention as set forth herein.

What is claimed is:

1. An epoxy resin composition comprising: (a) an epoxy resin having two or more epoxy groups in each molecule; (b) a phenolic resin composition comprising a condensation product of: (i) a phenol; (ii) a compound having a triazine ring; and (iii) an aldehyde, said condensation product being substantially free from any unreacted aldehyde, or methylol groups; (c) 5 to 50 parts by weight, relative to a total of 100 parts by weight of the epoxy resin (a) and the phenolic resin composition (b), of an epoxy-modified polybutadiene rubber component; and (d) a curing accelerator, said epoxy resin composition having minute protrusions having a maximum height (Ry) ≦1.0 μm, formed on its surface by thermosetting it at or above 80° C.

2. An epoxy resin composition as set forth in claim 1, comprising 0.5 to 1.3 phenolic hydroxyl equivalents of the phenolic resin composition (b) relative to one epoxy equivalent of the epoxy resin (a), and 0.05 to 10 parts by weight of the curing accelerator (d) relative to a total of 100 parts by weight of the epoxy resin (a) and the phenolic resin composition (b).

3. An epoxy resin composition as set forth in claim 1, comprising as the phenolic resin component (b) a novolak resin containing a triazine structure represented by the following formula:

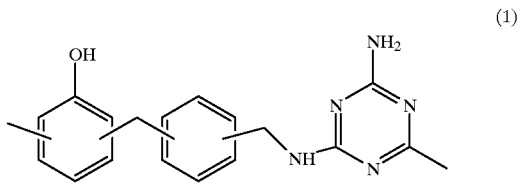

4. An epoxy resin composition as set forth in claim 1, wherein the epoxy resin (a) is selected from the group consisting of a phenol novolak epoxy resin, an alkylphenol novolak epoxy resin, a bisphenol epoxy resin, a naphthalene epoxy resin, a dicyclopentadiene epoxy resin, an epoxidated product of a condensation product of phenols and aromatic aldehydes having phenolic hydroxyl groups, triglycidyl isocyanurate, an alicyclic epoxy resin, and a brominated product of any of the above epoxy resins.

5. An epoxy resin composition as set forth in claim 4, wherein said bisphenol epoxy resin is selected from the group consisting of a bisphenol A epoxy resin, a bisphenol F epoxy resin, and a bisphenol S epoxy resin.

6. An epoxy resin composition as set forth in claim 1, wherein said curing accelerator (d) is selected from the group consisting of imidazoles, tertiary amines, guanidines, epoxy adducts, microcapsulated products thereof, and organic phosphine compounds.

7. An epoxy resin composition as set forth in claim 3, wherein said epoxy resin (a) is a bisphenol A epoxy resin.

8. A process for manufacturing a multilayer printed-wiring board comprising applying an epoxy resin composition as set forth in claim 1, on a patterned internal-layer circuit board, thermosetting said composition at or above 80° C., and forming a conductor layer on said epoxy resin composition by plating.

9. A process for manufacturing a multilayer printed-wiring board comprising applying an epoxy resin composition as set forth in claim 2, on a patterned internal-layer circuit board, thermosetting said composition at or above 80° C., and a forming conductor layer on said epoxy resin composition by plating.

10. The process of claim 8, further comprising roughening the surface of said epoxy resin composition with an oxidizing agent, after it has been thermoset and prior to forming said conductor layer.

11. The process of claim 9, further comprising roughening the surface of said epoxy resin composition with an oxidizing agent, after it has been thermoset and prior to forming said conductor layer.

12. The process of claim 8, wherein said thermosetting is performed at a temperature of between 100° C. and 180° C.

13. The process of claim 8, wherein said thermosetting is carried out for about 15 to 90 minutes.

* * * * *

UNITED STATES PATENT AND TRADEMARK OFFICE
CERTIFICATE OF CORRECTION

PATENT NO. : 6,133,377

DATED : October 17, 2000

INVENTOR(S): Shigeo NAKAMURA, et al.

It is certified that an error appears in the above-identified patent and that said Letters Patent is hereby corrected as shown below:

On the Title Page, Item [54], and Column 1, the Title is incorrect. Item [54] should read as follows:

--[54] COMPOSITION OF EPOXY RESIN, PHENOL-TRIAZINE-ALDEHYDE CONDENSATE AND RUBBER --

Signed and Sealed this

Eighth Day of May, 2001

Attest:

NICHOLAS P. GODICI

*Attesting Officer*  *Acting Director of the United States Patent and Trademark Office*